(12) United States Patent
Park et al.

(10) Patent No.: US 6,275,066 B1
(45) Date of Patent: Aug. 14, 2001

(54) CURRENT-MODE BIDIRECTIONAL INPUT/OUTPUT BUFFER FOR IMPEDANCE MATCHING

(75) Inventors: Hong-june Park, Pohang; Jae-yoon Sim, Gwangju, both of (KR)

(73) Assignee: Pohang University of Science and Technology Foundation, Pohang (KR)

( * ) Notice: Subject to any disclaimer, the term of this patent is extended or adjusted under 35 U.S.C. 154(b) by 0 days.

(21) Appl. No.: 09/545,461

(22) Filed: Apr. 7, 2000

(30) Foreign Application Priority Data

Apr. 14, 1999  (KR) .................................................. 99-13140

(51) Int. Cl.[7] .............................................. H03K 19/0175
(52) U.S. Cl. .................................................. 326/86; 326/83
(58) Field of Search .............................. 326/83, 86, 112, 326/119, 121

(56) References Cited

U.S. PATENT DOCUMENTS

| | | | |
|---|---|---|---|
| 5,587,709 | * | 12/1996 | Jeong ..................................... 341/100 |
| 6,002,268 | * | 12/1999 | Sasaki et al. ........................... 326/41 |
| 6,075,384 | * | 6/2000 | Sim et al. ................................ 326/86 |

* cited by examiner

Primary Examiner—Michael Tokar
Assistant Examiner—Don Phu Le
(74) Attorney, Agent, or Firm—Leydig, Voit, & Mayer, Ltd

(57) ABSTRACT

A current-mode bidirectional input/output buffer circuit for impedance matching and operation at a high speed. The current-mode bidirectional input/output buffer circuit communicates with an external chip having the same current-mode bidirectional input/output buffer. In the buffer, a transmitting-receiving average voltage output unit converts an average current value between a transmission signal to be transmitted to the external chip and a receiving signal transmitted from the external chip, into an average voltage. A reference voltage output unit converts a reference current value selectively generated according to a voltage level of the transmission signal, into a reference voltage. A comparator compares the voltage from the transmitting-receiving average voltage output unit to the voltage from the reference voltage output unit to provide a logic signal corresponding to the received signal transmitted from the external chip. A bias voltage generator generates a bias voltage such that the impedance of each output unit is matched with a characteristic impedance of a transmission line coupled to the external chip, and provides the bias voltage to the transmitting-receiving average voltage output unit and the reference voltage output unit. Accordingly, the current-mode bidirectional input/output buffer transmits data between chips at a high rate using a single transmission line and is stable in spite of variations in processes for fabricating chips.

8 Claims, 5 Drawing Sheets

CURRENT-MODE BIDIRECTIONAL INPUT/OUTPUT BUFFER FOR IMPEDANCE MATCHING

BACKGROUND OF THE INVENTION

1. Field of the Invention

The present invention relates to a bidirectional input/output buffer, and more particularly, to a bidirectional input/output buffer for impedance matching, which allows data to be simultaneously sent and received over a single transmission line between two chips in a current-mode.

2. Description of the Related Art

As processes for fabricating integrated circuits improve, the performance of systems for achieving high speed operation may be significantly limited by the data transmission speed between chips. A bidirectional input/output buffer, a type of input/output buffer for data transmission, simultaneously sends and receives data over a single cable so that transmission performance of each single cable is doubled, and recovers only the received signals from the outside.

FIG. 1 is a schematic diagram showing the structure of a signal transmission system of a conventional bidirectional input/output buffer circuit. Bidirectional input/output buffers are respectively provided in chips 100A and 100B for transmission of data between the two chips 100A and 100B which are coupled to a transmission line having an impedance $Z_0$ in FIG. 1. The bidirectional input/output buffers include; transmitting terminals to which transmission signals IN1 and IN2, to be sent to other chips, are applied; input/output nodes OUT1 and OUT2 through which signal voltages are sent to other chips and signal voltages from the other chips are received; recovering terminals RET1 arid RET2 at which the received signals from other chips have recovered original values; reference voltage generators 103a and 103b for respectively generating reference voltages Vref1 and Vref2 which are selected according to voltages of the transmission signals IN1 and IN2 and which are respectively compared with voltage values of the input/output nodes OUT1 and OUT2 each having a voltage value in which the signal to be transmitted outwardly and the signal received from the outside are mixed, to recover the signals received from the outside in the two chips 100A and 100B; output buffers 101a and 101b for respectively buffering the transmission signals IN1 and IN2; and voltage comparators 102a and 102b for comparing the reference voltages from the reference voltage generators 103a and 103b with the voltages of the input/output nodes OUT1 and OUT2 respectively.

In the operation of the signal transmission system of FIG. 1, voltages applied to the input/output nodes OUT1 and OUT2 according to the transmission signal IN1 to be outwardly transmitted and the signal IN2 received from the outside in one chip 100A, appear to be the average value of signal voltages transmitted by the two chips 100A and 100B. At this time, assuming that the voltage values transmitted between the two chips 100A and 100B are classified into only two levels, 0 volts and a high level voltage having a predetermined value, the input/output node OUT1 has a high level voltage, a ½ high level voltage or 0. The voltages of the input/output nodes OUT1 and OUT2 are respectively compared with the reference values Vref 1 and Vref 2 which are generated by the reference voltage generators 103a and 103b according to the transmission signals IN1 and IN2, to provide original signal levels. Table 1 shows the reference voltages Vref1 and Vref2, which depend on the voltage values of the transmission signals IN1 and IN2, and signal values recovered from the level values of the input/output nodes OUT1 and OUT2 at the recovering terminals RET1 and RET2 in the conventional, bidirectional input/output buffers.

TABLE 1

| IN1 | High | High | Low | Low |
|---|---|---|---|---|
| IN2 | High | Low | High | Low |
| OUT1, OUT2 | VDD | 0.5 VDD | 0.5 VDD | 0 |
| Vref1 | 0.75 VDD | 0.75 VDD | 0.25 VDD | 0.25 VDD |
| Vref2 | 0.75 VDD | 0.25 VDD | 0.75 VDD | 0.25 VDD |
| RET1 | High | Low | High | Low |
| RET2 | High | High | Low | Low |

It can be known from Table 1 that the transmission signals IN1 and IN2 are respectively transmitted to the corresponding recovering terminals RET2 and RET1 of the other chips at the same level value. However, since conventional bidirectional input/output buffers operate in a voltage-mode, full voltage swing appears at nodes which have capacitor components in the circuits of the bidirectional input/output buffers. In this situation, switching speed is slowed down, which causes the transmission speed of the bidirectional buffer to be limited.

SUMMARY OF THE INVENTION

To solve the above problems, it is an object of the present invention to provide a current-mode bidirectional input/output buffer which can perform impedance matching in which an impedance has a stable characteristic in spite of variations in processes for fabricating chips, for achieving high rate data transmission between the chips.

To achieve the object of the present invention, there is provided a current-mode bidirectional input/output buffer which communicates signals with an external chip having the same current-mode bidirectional input/output buffer. The current-mode bidirectional input/output buffer includes a transmitting-receiving average voltage output unit for converting an average current value between a transmission signal to be transmitted to the external chip and a receiving signal transmitted from the external chip, into an average voltage; a reference voltage output unit for converting a predetermined reference current value selectively generated according to a voltage level of the transmission signal, into a reference voltage; a comparator for comparing the voltage from the transmitting-receiving average voltage output unit with the voltage from the reference voltage output unit to provide a logic signal corresponding to the received signal transmitted from the external chip; and a bias voltage generator for generating a bias voltage such that the impedance of each output unit is matched with a characteristic impedance of a transmission line coupled to the external chip, and for providing the bias voltage to the transmitting-receiving average voltage output unit and the reference voltage output unit.

The current-mode bidirectional input/output buffer also includes a CMOS level converter for converting the output of the comparator into a CMOS level.

In the bias voltage generator, first and third PMOS transistors are coupled in serial between a power supply voltage VDD and a negative input terminal of a second operational amplifier; second and fourth PMOS transistors are coupled in serial between the power supply voltage VDD and a positive input terminal of the second operational amplifier; the output terminal of a first operational amplifier is coupled to gates of the first and second PMOS transistors in common; a positive input terminal of the first operational amplifier is coupled to the negative input terminal of the second operational amplifier and one end of an external resistor; the other end of the external resistor is coupled to ground; the output terminal of the second operational amplifier is coupled to the gate of a first NMOS transistor; and the drain and source of the first NMOS transistor are respectively coupled to the positive input terminal of the second operational amplifier and ground.

In the transmitting-receiving average voltage output unit, a first constant current source is coupled between the power supply voltage VDD, the anode of a first diode and the drain of a second NMOS transistor; an inverted transmission signal is applied to the gate of the second NMOS transistor, the cathode of the first diode is coupled to the transmission line of the external chip, the drain of a third NMOS transistor and the positive input terminal of the comparator; and the gate of the third NMOS transistor is coupled to the gate of the first NMOS transistor.

The first constant current source operates with each gate voltage of the second and fourth PMOS transistors as a bias voltage.

In the reference voltage output unit, a second constant current source and a switch unit for switching according to a level of the transmission signal are coupled in serial between the power supply voltage VDD and the anode of a second diode; a third constant current source is coupled between the power supply voltage VDD and the anode of the second diode; the cathode of the second diode is coupled to the drain of a fourth NMOS transistor and a negative input terminal of the comparator; the source of the fourth NMOS transistor is coupled to the ground; and the gate of the fourth NMOS transistor is coupled to the gate of the first NMOS transistor.

The second and third constant current sources operate with each gate voltage of the second and fourth PMOS transistors as the bias voltage.

In the switch unit, fifth and sixth PMOS transistors are coupled in serial between the power supply voltage VDD and the drain of the fifth and sixth NMOS transistors, respectively, a seventh PMOS transistor and a seventh NMOS transistor are coupled in serial between an output terminal and ground; the gate of the seventh NMOS transistor is coupled to the drain and gate of the sixth NMOS transistor; the drain of the seventh PMOS transistor is coupled to the anode of the second diode; gates of the fifth and sixth PMOS transistor are coupled to the gates of the second and fourth PMOS transistors, respectively; and sources of the fifth and sixth PMOS transistors are coupled to ground.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
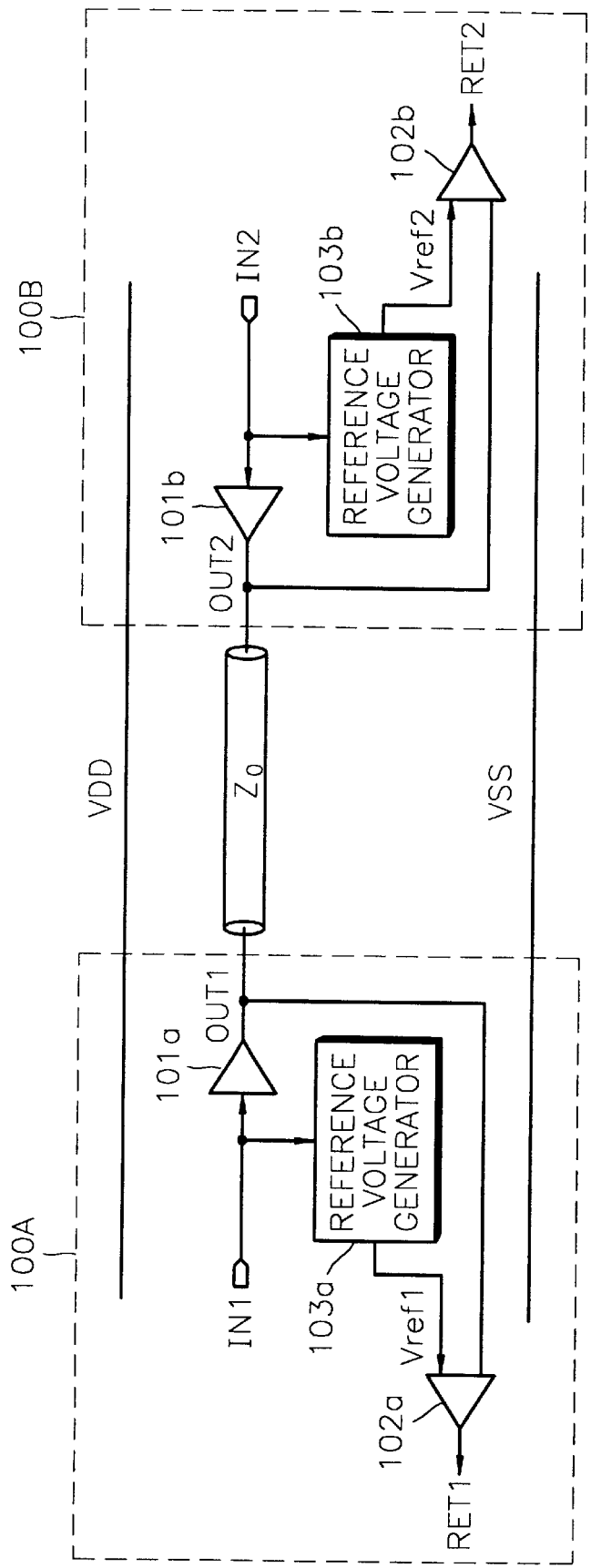
FIG. 1 is a diagram for explaining a conventional voltage-mode bidirectional input/output buffer.
Figure 2:
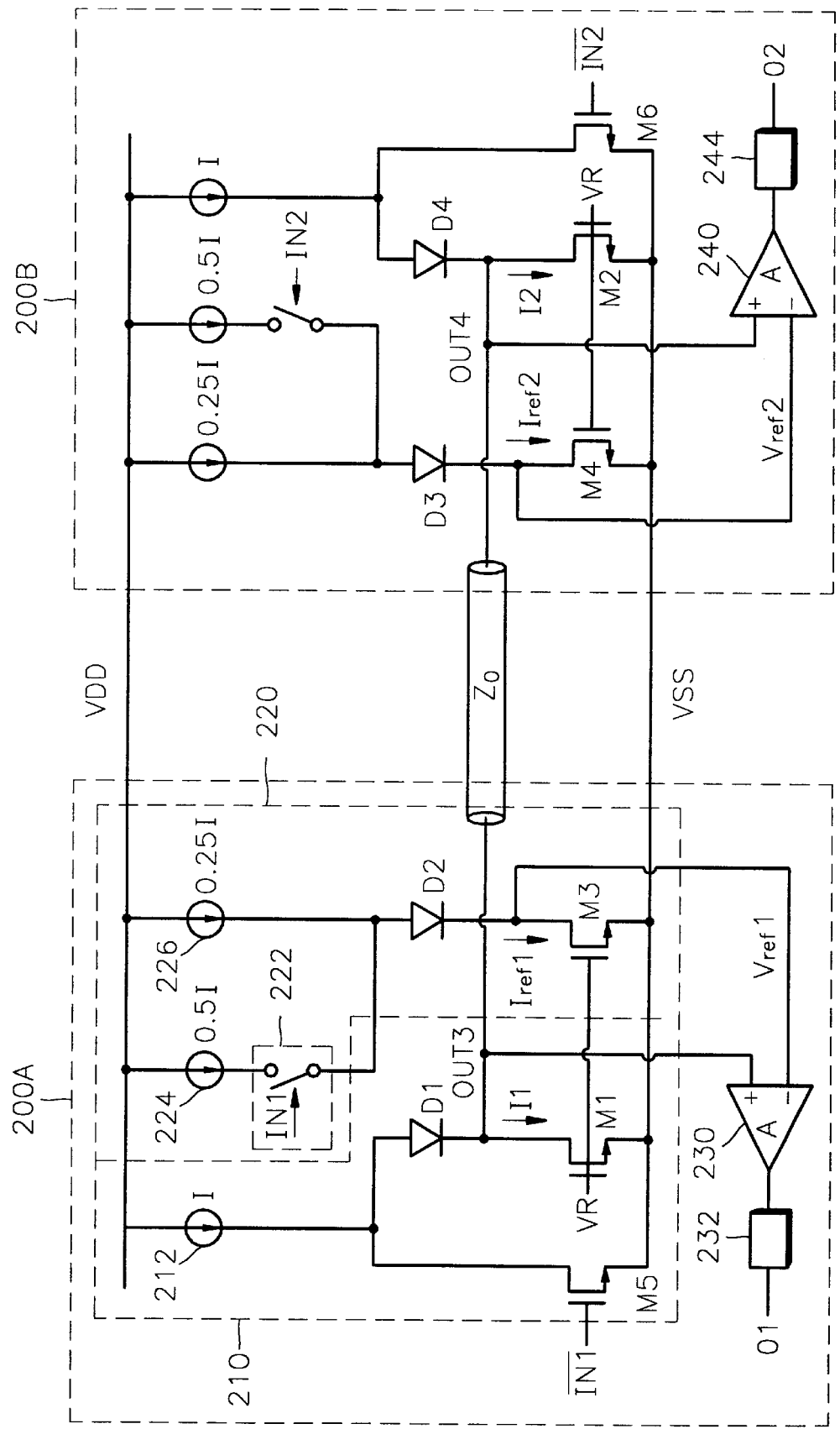
FIG. 2 is a schematic diagram showing a bidirectional input/output buffer according to the present invention.

In an embodiment of the present invention, current-mode bidirectional input/output buffers having the same structure are respectively provided in chips 200A and 200B in FIG. 2. Referring to FIG. 2, in the current-mode bidirectional input/output buffer provided in the chip 200A, a power supply voltage VDD is coupled to the drain of an NMOS transistor M5 and the anode of a diode D1 via a first constant current source 212. The cathode of the diode D1 is coupled to a drain of an NMOS transistor M1, and the positive input terminal of a comparator 230. The cathode of the diode D1 is also coupled to the bidirectional input/output buffer of the other chip 200B via a transmission line having an impedance $Z_0$. Gates of NMOS transistors M1 and M3 are coupled in common to a bias voltage generation circuit which is not shown. The voltage VDD is coupled to a second constant current source 224 in serial with the anode of a diode D2 via a switch unit 222 for switching according to the level of a transmission signal IN1. The voltage VDD is also coupled to the anode of the diode D2 via a third constant current source 226. The cathode of the diode D2 is coupled to the drain of the NMOS transistor M3 and the negative input terminal of the comparator 230.

The first, second and third constant current Sources 212, 224 and 226 of the bidirectional input/output buffer have current values of I, 0.5I and 0.25I, respectively. The 0.5I current is switched by the level of the transmission signal IN1 or IN2. A reference current Iref1 or Iref2 is compared with current flowing through an input/output node OUT3 or OUT4. When the transmission signals IN1 and IN2 are high, the reference currents Iref1 and Iref2 are 0.75I. When the transmission signals IN1 and IN2 are low, the reference currents Iref1 and Iref2 are 0.25I.

Referring to FIG. 2, in one chip 200A, the average current between the transmission signal IN1 to be transmitted outwardly and the transmission signal IN2 received from the other chip 200B flows through the drain of the NMOS transistor M1 and the drain of an NMOS transistor M2 which are coupled to the input/output nodes OUT3 and OUT4, respectively, at the same currents I1 and I2, respectively. Assuming that the signals to be transmitted between the two chips 200A and 200B have only two levels of values, that is, 0 volts as a low level, and a high level, the currents I1 and I2 have one among the three current values 0, 0.5I and I. Inverted transmission signals $\overline{IN1}$ and $\overline{IN2}$ generated by invertors (not shown) are applied to the gates of NMOS transistors M5 and M6, respectively. In other words, when the transmission signals IN1 and IN2 are both high, the low level is applied to the gates of the NMOS transistors M5 and M6 so that the current I of the first constant current source 212 does not flow through the NMOS transistors M5 but through the diode D2 in the chip 200A, and the current I flows through a diode D4 in the chip 200B in the same manner. At this time, the currents I1 and I2 flowing through the NMOS transistors M1 and M2 become to have the value I. When one of the transmission signals IN1 and IN2 is high and the other is low, the current I1 and I2 become to have the value 0.5I. When the transmission signals IN1 and IN2 are both low, the current I1 and I2 become to have the value 0.

The switch unit 222 is turned on when the transmission signal IN1 is high so that the output current 0.5I of the second constant current source 224 is added to the current 0.25I of the third constant current source 226 and then the resultant current flow to the NMOS transistor M3 via the diode D2. At this time, the NMOS transistors M1, M2, M3 and M4 are operated in a triode region by a bias voltage VR and act as resistors. When the bias voltage VR is controlled, the output resistance of the transistors M1 through M4 is matched to the characteristic impedance $Z_0$ of the transmission line, thereby preventing reflection wave during the signal transmission.

Drain-to-source voltage due to the current I1 and Iref1 flowing through the NMOS transistors M1 and M3, respectively, are input into the positive and negative input terminals of the comparator 230, respectively, and then compared with each other. At this time, the drain-to-source voltage of the NMOS transistor M3 due to the current Iref1 is a reference voltage Vref1. The resultant voltage level of the comparison is converted into a CMOS level in a CMOS voltage level converter 232 and then provided to a recovering terminal 01.

In the same manner, the bidirectional input/output buffer is installed in the other chip 200B, so that the voltage due to the reference current Iref2, flowing through the NMOS transistor M4 depending on the transmission signal IN2, is compared with the voltage due to the current I2 flowing through the NMOS transistor M2 by the comparator 240. The output voltage of the comparator 240 is converted into a CMOS level in a CMOS level converter 244 and then provided to a recovering terminal 02. Here, the diodes D1, D2, D3 and D4 guarantee unidirectional current flow and each may be implemented by coupling a gate to a drain in a MOS transistor. Reference numeral 210 is a transmitting-receiving average voltage output unit for converting the average current I1, i.e., the average of the transmission signal IN1 and the transmission signal IN2 which is received from the external chip 200B, into the average voltage. Reference numeral 220 is a reference voltage output unit for converting the predetermined reference current Iref1, which is selectively generated according to the current level of the transmission signal IN1, into the reference voltage Vref1. Table 2 shows the values of the reference current, which depend on the transmission signals IN1 and IN2 and their output voltages.

TABLE 2

| IN1 | High | High | Low | Low |
|---|---|---|---|---|
| IN2 | High | Low | High | Low |
| OUT1, OUT2 | I | 0.5 I | 0.5 I | 0 |
| Iref1 | 0.75 I | 0.75 I | 0.25 I | 0.25 I |
| Iref2 | 0.75 I | 0.25 I | 0.75 I | 0.25 I |
| 01 | High | Low | High | Low |
| 02 | High | High | Low | Low |

Figure 3:
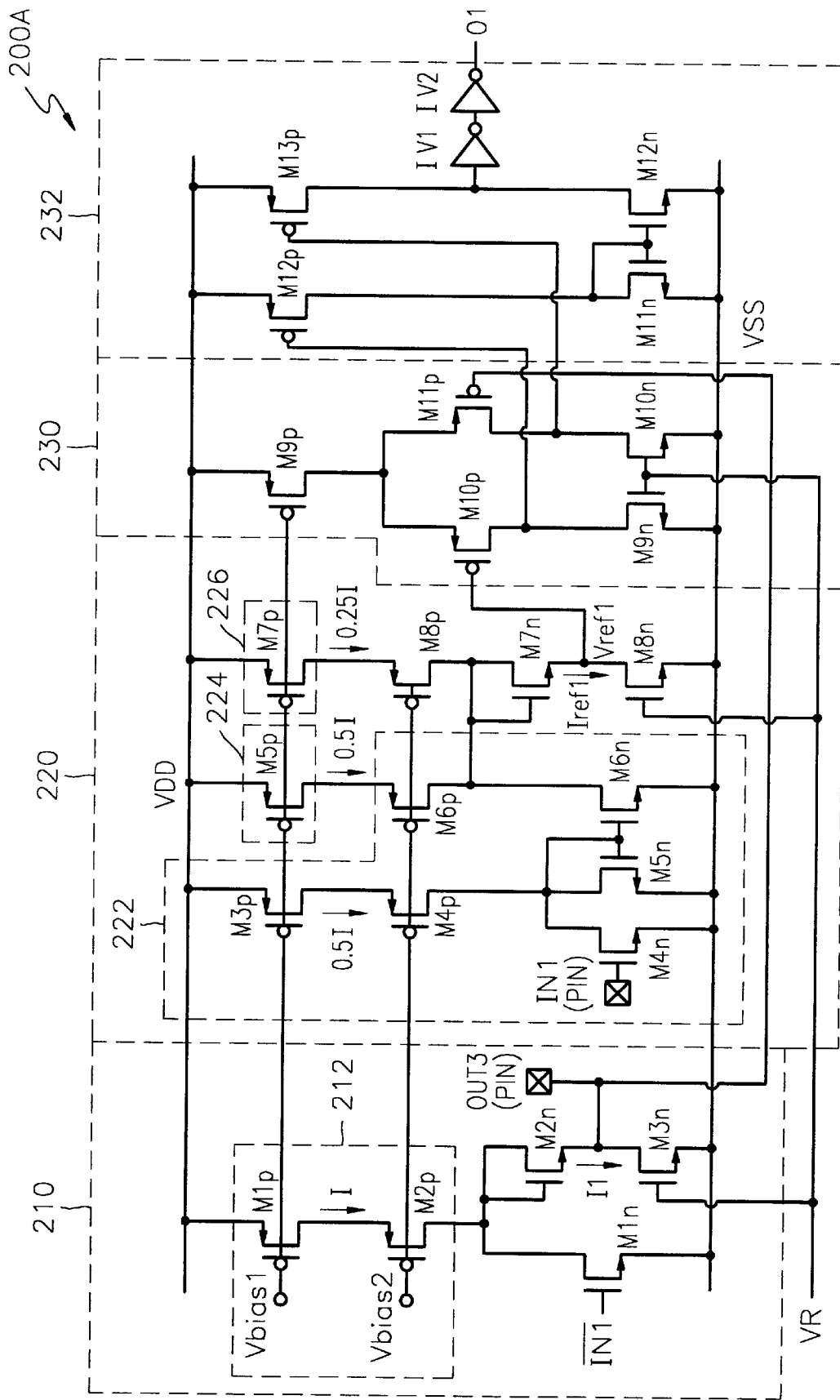
FIG. 3 is a detailed circuit diagram of the bidirectional input/output buffer depicted in FIG. 2.
Figure 4:
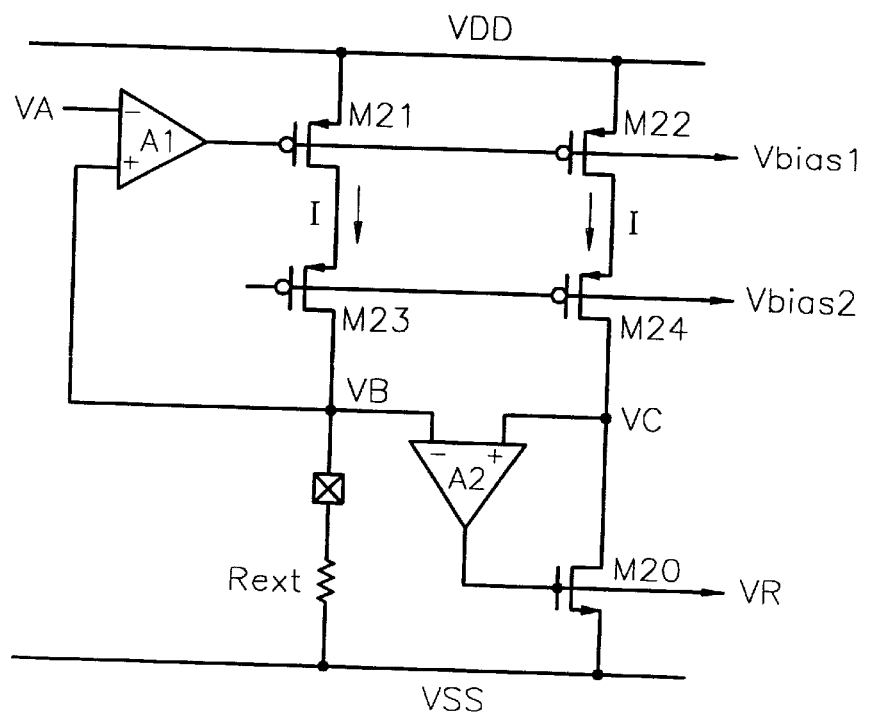
FIG. 4 is a diagram of a bias voltage generation circuit which is applied to FIG. 3.

FIG. 3 is a detailed circuit diagram of the bidirectional input/output buffer depicted in FIG. 2. FIG. 4 shows a bias voltage generation circuit which is not shown in FIG. 2. Referring to FIG. 4 in the bias voltage generation circuit for generating the bias voltage VR, PMOS transistors M21 and M23 are coupled in serial between a voltage VDD and the positive input terminal of the second operational amplifier A2. PMOS transistors M22 and M24 are coupled in serial between a voltage VDD and the negative input terminal of the second operational amplifier A2. The output of the first operational amplifier A1 is coupled to gates of the PMOS transistors M21 and M22. The positive input terminal of the first operational amplifier A1 is coupled to the negative input terminal of the second operational amplifier A2 and one end of an external resistor Rext. The other end of the external resistor Rext is coupled to ground VSS. The output terminal of the second operational amplifier A2 is coupled to the gate of an NMOS transistor M20. The drain and source of the NMOS transistor M20 are coupled to the positive input terminal of the second operational amplifier A2 and to ground VSS, respectively.

In the operation of the bias voltage generation circuit depicted in FIG. 4, the first operational amplifier A1 generates a voltage which is output to the gate of the PMOS transistor M21 such that a current I flows in the PMOS transistor M21. The gate of the PMOS transistor M21 is coupled to the gate of the PMOS transistor M22 in common so that the current flowing in the PMOS transistors M23 and M24 and the NMOS transistor M20 is equal to the value I. The first and second operational amplifiers A1 and A2 are coupled to each other in a negative feedback loop so that a voltage VA applied to the negative input terminal of the first operational amplifier A1 is equal to voltages VB and VC respectively applied to the negative and positive input terminals of the second operational amplifier A2. Accordingly, the current I flowing in the external resistor Rext is equal to the value of VA/Rext. Moreover, a drain voltage value of the NMOS transistor M20 is equal to the voltage VA. Consequently, the output of the second operational amplifier A2 generates a gate voltage such that a value of output resistance of the NMOS transistor M20 is equal to a resistance value of the external resistor Rext.

When the resistance value of the external resistor Rext is set to the characteristic impedance $Z_0$ of the transmission line coupled to an external chip, output resistance of the bidirectional input/output buffer can be equal to the characteristic impedance $Z_0$. In addition, the bias voltage VB determining the current value I of each constant current source of the bidirectional input/output buffer is simultaneously generated so that the current value I is determined by the voltage VA and the value of the external resistor Rext applied from the outside. Thus, the current value I is fixed to the value of VA/Rext. Therefore, although threshold voltage and mobility of the NMOS transistor M1 in FIG. 2 is different between different chips due to variations in chip fabrication processes, the output resistance of the NMOS transistor M1 can be stably matched to the characteristic impedance of the transmission line by the bias voltage generation circuit described above, because the output resistance of the NMOS transistor M1 is determined in accordance with the voltage value of the gate of the NMOS transistor M1.

In FIG. 3, the elements designated by reference numerals 210 through 232 correspond to the elements designated by the same reference numerals in FIG. 2. The NMOS transistors M1, M3 and M5 in FIG. 2 respectively correspond to the NMOS transistors M3n, M8n and M1n in FIG. 3. In the switch unit 222, PMOS transistors M3p and M4p are coupled in serial between the voltage VDD and drains of NMOS transistors M4n and M5n. A PMOS transistor M6p and an NMOS transistor M6n are coupled in serial between an output terminal of the second constant current source 224 and ground VSS.

The gate of the NMOS transistor M6n is coupled to gate and drain of the NMOS transistor M5n in common. The drain of the PMOS transistor M6p is coupled to the anode of an NMOS transistor M7n implementing the diode D2 of FIG. 2. Gates of the PMOS transistors M3p and M4p are respectively coupled to gates of the PMOS transistors M22 and M24 of FIG. 4. Accordingly, when the transmission signal IN1 applied to the gate of the NMOS transistor M4n is high, the NMOS transistor M6n is cut off so that current 0.5I output from the drain of the PMOS transistor M6p flows through the NMOS transistor M7n functioning as a diode, thereby achieving a switching function.

Figure 5A:
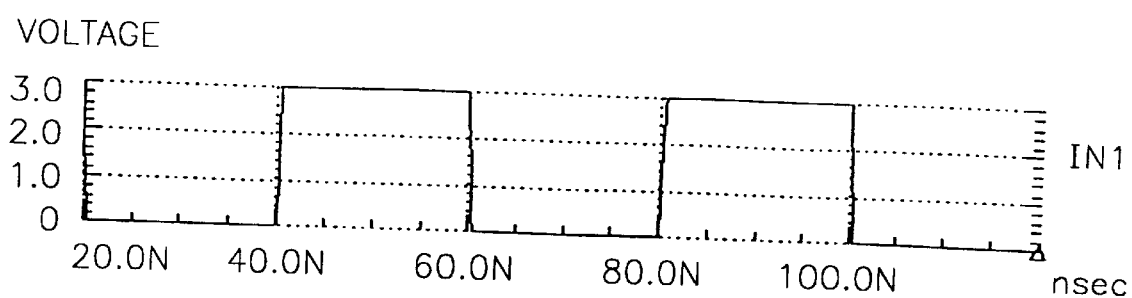
FIGS. 5A through 5E show signal waveforms in the bidirectional input/output buffer according to the present invention.
Figure 5B:
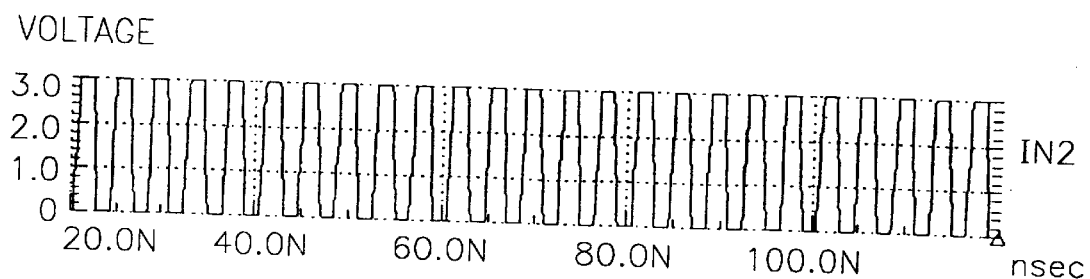
Figure 5C:
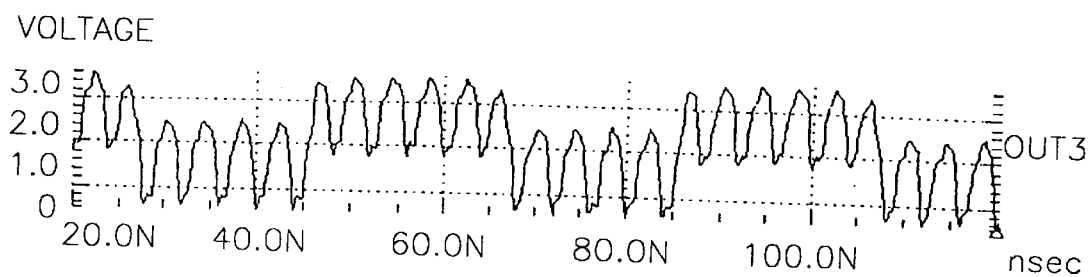
Figure 5D:
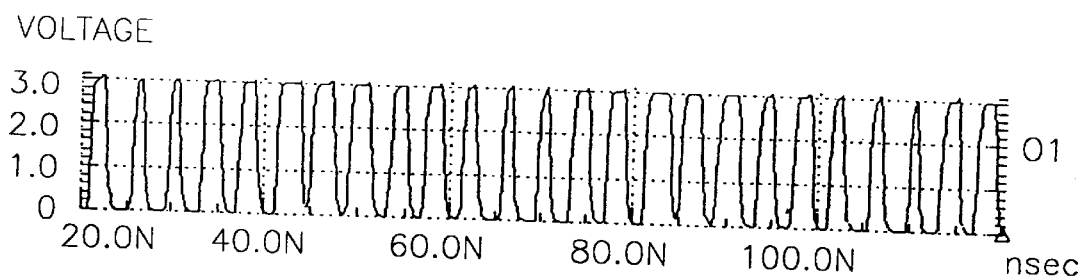
Figure 5E:
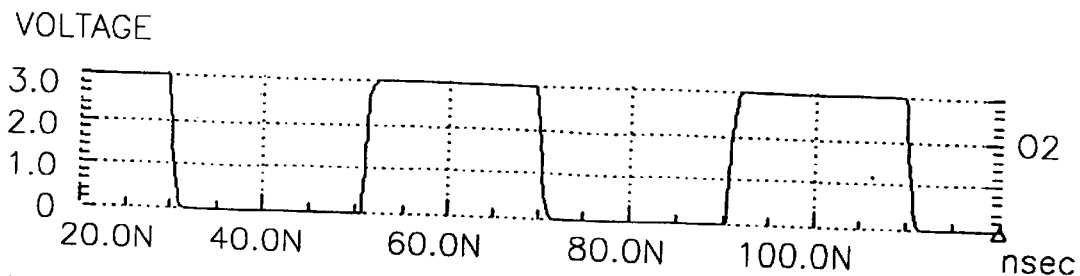

FIGS. 5A through 5E are waveform diagrams obtained from simulation of the bidirectional input/output buffer according to the present invention. FIG. 5A shows a waveform of the transmission signal IN1 which is transmitted at a rate of 50 Mb/s at a supply voltage of 3 V. FIG. 5B shows a waveform of the transmission signal IN2 which is transmitted at a rate of 500 Mb/s at a supply voltage of 3 V. FIG. 5C shows a node voltage waveform of the input/output node OUT3. FIGS. 5D and 5E show recovered waveforms appearing at the recovering terminal 01 and 02, respectively. The recovered waveforms are obtained in such a manner that the transmission signals IN2 and IN1 are respectively recovered in the other bidirectional input/output buffer and then output through the recovering terminals 01 and 02. Here, it is found out that the current-mode bidirectional input/output buffer which can perform impedance matching according to the present invention, has bidirectional transmission performance of 1 Gb/s.

According to the present invention, the current-mode bidirectional input/output buffer which can perform impedance matching, transmits data between chips at a high rate using a single transmission line and has stable electrical characteristics in spite of variations in processes for fabricating chips.

What is claimed is:

1. A current-mode bidirectional input/output buffer which communicates with an external chip having the same current-mode bidirectional input/output buffer, the buffer comprising:

a transmitting-receiving average voltage output unit having an impedance and converting an average current between a transmission signal to be transmitted to an external chip and a receiving signal transmitted from the external chip, into an average voltage;

a reference voltage output unit having an impedance and converting a reference current value selectively generated according to a voltage level of the transmission signal, into a reference voltage;

a comparator having positive and negative input terminals and comparing the voltage from the transmitting-receiving average voltage output unit with the voltage from the reference voltage output unit to provide a logic signal corresponding to the received signal transmitted from the external chip; and a bias voltage generator for generating a bias voltage so that the impedances of each of the transmitting-receiving average voltage output unit and the reference voltage output unit are matched with a characteristic impedance of a transmission line coupled to the external chip, and for providing the bias voltage to the transmitting-receiving average voltage output unit and the reference voltage output unit.

2. The current-mode bidirectional input/output buffer of claim 1, further comprising a CMOS level converter for converting the logic signal output by the comparator into a CMOS level.

3. The current-mode bidirectional input/output buffer of claim 1, wherein, in the bias voltage generator, first and third PMOS transistors are coupled in series between a power supply voltage, VDD, and a negative input terminal of a second operational amplifier;

second and fourth PMOS transistors are coupled in series between the power supply voltage, VDD, and a positive input terminal of the second operational amplifier;

an output terminal of a first operational amplifier is commonly coupled to gates of the first and second PMOS transistors;

a positive input terminal of the first operational amplifier is coupled to the negative input terminal of the second operational amplifier and a first end of an external resistor;

a second end of the external resistor is coupled to ground;

an output terminal of the second operational amplifier is coupled to a gate of a first NMOS transistor having a source and a drain; and the drain and source of the first NMOS transistor are respectively coupled to the positive input terminal of the second operational amplifier and ground.

4. The current-mode bidirectional input/output buffer of claim 3, wherein, in the transmitting-receiving average voltage output unit, a first constant current source is coupled between the power supply voltage, VDD, an anode of a first diode having a cathode, and a drain of a second NMOS transistor;

an inverted transmission signal is applied to the gate of the second NMOS transistor, the cathode of the first diode is coupled to the transmission line of the external chip, a drain of a third NMOS transistor having a gate, and the positive input terminal of the comparator; and the gate of the third NMOS transistor is coupled to the gate of the first NMOS transistor.

5. The current-mode bidirectional input/output buffer of claim 4, wherein the first constant current source operates with each gate voltage of the second and fourth PMOS transistors as a bias voltage.

6. The current-mode bidirectional input/output buffer of claim 5, wherein, in the reference voltage output unit, a second constant current source and a switch unit for switching according to level of the transmission signal are coupled in series between the power supply voltage, VDD, and an anode of a second diode having a cathode;

a third constant current source is coupled between the power supply voltage, VDD, and the anode of the second diode;

the cathode of the second diode is coupled to a drain of a fourth NMOS transistor having a source and a gate, and to a negative input terminal of the comparator;

the source of the fourth NMOS transistor is coupled to ground; and the gate of the fourth NMOS transistor is coupled to the gate of the first NMOS transistor.

7. The current-mode bidirectional input/output buffer of claim 6, wherein the second and third constant current sources operate with each gate voltage of the second and fourth PMOS transistors as the bias voltage.

8. The current-mode bidirectional input/output buffer of claim 7, wherein, in the switch unit, fifth and sixth PMOS transistors having gates and sources are coupled in series between the power supply voltage, VDD, and drains of the fifth and sixth NMOS transistors, respectively;

a seventh PMOS transistor having a gate and a drain, and a seventh NMOS transistor are coupled in series between an output terminal of the buffer and ground;

the gate of the seventh NMOS transistor is coupled to the drain and a gate of the sixth NMOS transistor;

the drain of the seventh PMOS transistor is coupled to the anode of the second diode;

the gates of the fifth and sixth PMOS transistors are coupled to the gates of the second and fourth PMOS transistors, respectively; and the sources of the fifth and sixth PMOS transistors are coupled to ground.

* * * * *